(12) United States Patent
Patel

(10) Patent No.: US 8,514,111 B1
(45) Date of Patent: Aug. 20, 2013

(54) HYBRID DIGITAL-TO-SYNCHRO CONVERTER UNIT

(75) Inventor: Bhavesh V. Patel, Bensalem, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/487,701

(22) Filed: Jun. 4, 2012

(51) Int. Cl.
*H03M 1/22* (2006.01)

(52) U.S. Cl.
USPC ............ 341/117; 341/111; 341/112; 341/116

(58) Field of Classification Search
USPC .................................. 341/111–117
See application file for complete search history.

(56) References Cited

U.S. PATENT DOCUMENTS

| | | | |
|---|---|---|---|
| 3,039,030 A * | 6/1962 | Weidner ........................ | 318/605 |
| 3,618,073 A | 11/1971 | Domchick et al. | |
| 3,993,993 A | 11/1976 | Griffin | |
| 3,997,893 A | 12/1976 | Games et al. | |
| 4,017,846 A * | 4/1977 | Aramaki ....................... | 341/116 |
| 4,062,005 A | 12/1977 | Freed et al. | |
| 4,164,729 A | 8/1979 | Simon et al. | |
| 4,216,466 A * | 8/1980 | Chasson et al. ............... | 341/117 |
| 4,281,316 A | 7/1981 | Simon et al. | |
| 4,375,636 A | 3/1983 | Stack et al. | |
| 4,401,932 A | 8/1983 | Hermansdorfer et al. | |
| 4,430,640 A * | 2/1984 | Hermansdorfer et al. .... | 341/117 |
| 4,795,954 A * | 1/1989 | Sakurai et al. ................ | 318/661 |
| 4,954,753 A | 9/1990 | Sikora | |
| 5,034,743 A | 7/1991 | Deppe et al. | |
| 5,173,696 A | 12/1992 | Howard et al. | |
| 5,585,709 A * | 12/1996 | Jansen et al. .................. | 318/807 |
| 5,646,496 A | 7/1997 | Woodland et al. | |
| 5,796,357 A * | 8/1998 | Kushihara ..................... | 341/116 |
| 6,069,576 A | 5/2000 | Gwin | |
| 6,172,627 B1 | 1/2001 | Nealy et al. | |
| 6,222,469 B1 | 4/2001 | Goode, III et al. | |
| 6,255,794 B1 * | 7/2001 | Staebler ........................ | 318/605 |
| 6,501,399 B1 * | 12/2002 | Byrd ............................. | 341/111 |
| 6,961,233 B2 | 11/2005 | Hoeing et al. | |
| 6,995,538 B2 * | 2/2006 | Hayashi .................. | 318/400.39 |
| 8,193,955 B2 | 6/2012 | Hermann | |
| 8,344,728 B2 * | 1/2013 | Majumdar et al. ............ | 324/309 |
| 2011/0037627 A1 | 2/2011 | Hermann | |

OTHER PUBLICATIONS

U.S. Appl. No. 61/666,509, invention entitled "Smart Synchro Generator Unit," filed Jun. 29, 2012, sole inventor Bhavesh V. Patel.
U.S. Appl. No. 13/905,208, co-pending, invention entitled "Smart Synchro Generator Unit," filed May 30, 2013, sole inventor Bhavesh V. Patel.

* cited by examiner

*Primary Examiner* — Linh Nguyen
(74) *Attorney, Agent, or Firm* — Howard Kaiser

(57) ABSTRACT

A digital-to-synchro converter ("DSC") is a device that converts digital signals to analog signals suitable for use by a synchro device. A conventional DSC implements complex circuitry to take digital input and generate [V Sin(ωt) Sin(Φ)] and [V Sin(ωt) Cos(Φ)] analog signals, and a Scott-T transformer to transform these analog signals into [V Sin(ωt) Sin(Φ)], [V Sin(ωt) Sin(Φ+120)], and [V Sin(ωt) Sin(Φ+240)] analog signals. An inventive DSC, as typically embodied, implements a microcontroller to take digital input and generate [V Sin(ωt) Sin(Φ)] and [V Sin(ωt) Sin(Φ+120)] digital signals, a digital-to-analog converter to convert these digital signals to [V Sin(ωt) Sin(Φ)] and [V Sin(ωt) Sin(Φ+120)] analog signals, and a regular transformer (i.e., non-Scott-T transformer) to transform these analog signals (typically, in amplified voltage form) into [V Sin(ωt) Sin(Φ)], [V Sin(ωt) Sin(Φ+120)], and [V Sin(ωt) Sin(Φ+240)] analog signals. Inventive practice is accurate, versatile, and economical.

18 Claims, 19 Drawing Sheets

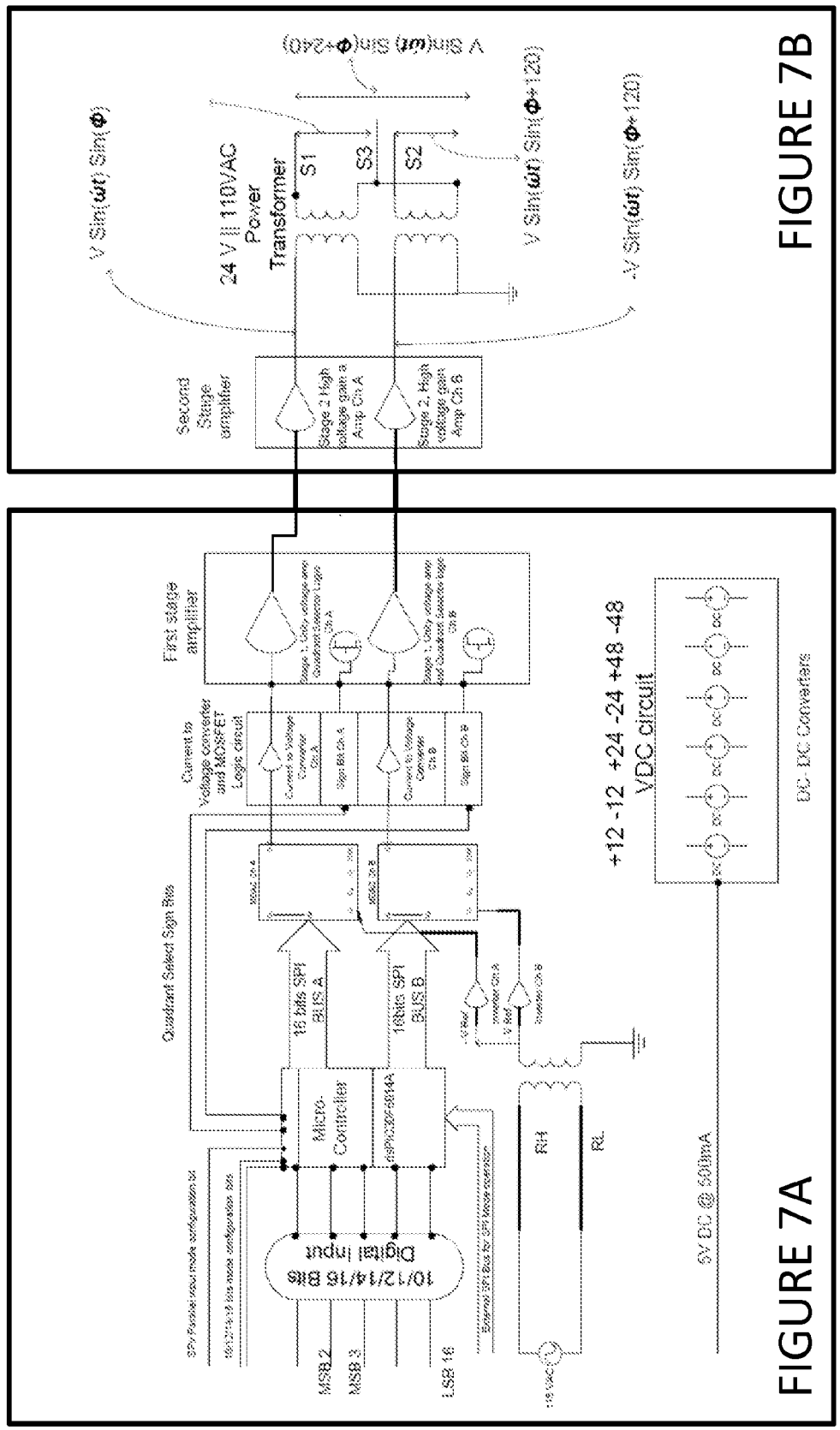

(I)

(II)

(III)

(IV)

1 → 180
1 → 90
1 0 → 45
0 0 → 22.5
0 0 0 0 0 0 0 0 0 0 0 0 0 → 0.002747 degree
0 0 0 0 = 270 degrees in decimal

FIG. 10

HYBRID DIGITAL-TO-SYNCHRO CONVERTER UNIT

BACKGROUND OF THE INVENTION

The present invention relates to synchros, more particularly to methods and devices for converting digital signals to a synchro's analog signals.

Synchros are analog electronic devices that have been used for many years, in both military and commercial contexts, for providing angular, positional, and other information pertaining to navigation, communication, detection, weaponry, etc. The noun "synchro" derives from the adjective "synchronous." Generally speaking, synchros look like electric motors (insofar as including a rotor, a stator, and a shaft) and operate like rotary electrical transformers. A synchro is a type of electrical transformer that measures and sets the angle of a rotating device.

Digital-to-synchro conversion is conversion of digital signals to synchro (analog) signals. Such conversion is necessary in order for synchros to make use of digital signals transmitted by any of various forms of digital (e.g., computer) technology. A digital-to-synchro converter (DSC) is a device frequently used to translate digital user input into signals that actuate a synchro. A conventional digital-to-synchro converter receives binary-coded decimal digital input, and changes it to a three-signal (e.g., three-wire) synchro output representing angular data corresponding to the received binary-coded decimal digital input.

Synchros are common in many commercial, defense, and maritime applications, and are widely used because of their reliability, robustness, and accuracy. For instance, synchros have been used to set the azimuth of satellite dishes, the direction of antennas, the angle of ship rudders, and the trajectory of weapons systems. AC-based synchro control systems are considered to be more suitable than DC-based control systems for many applications. In many large artillery systems, desired target angles are entered through a computer interface, which sends a digital signal to the digital-to-synchro converter; in turn, the DSC generates an equivalent synchro signal to actuate the rotation of the weapon to the proper angle.

Existing compact synchro conversion units are manufactured by few companies. Frequently, commercially available synchros are beset with monopolistic high costs, long procurement lead times, and inadequate accuracy. Only two companies in the world, viz., Data Device Corporation (DDC) and Computer Conversions Corporation (CCC), manufacture compact digital-to-synchro conversion units with an accuracy of 14 bits resolution/110 VAC, and with a maximum driving load of 4.5 VA (39 mA @115 VAC). Conventional digital-to-synchro conversion units offer 14 bits digital resolution with an accuracy of ±4 min error. A product with 16-bits accuracy and 110 VAC range is not available in the market.

Among the technical problems that have been encountered through use of currently available digital-to-synchro converter units (DSCU) are the following: inability to drive a large load (resistive, inductive, or capacitive), e.g., of higher than 4.5 VA; malfunction or total failure; overloading of synchro channels; high temperatures; and, power surges.

Furthermore, existing digital-to-synchro converters use passive electrical (analog) components. In order to generate the synchro signals, these devices rely on precisely manufactured specialty transformers called "Scott-T transformers." Low-tolerance manufacturing and low-volume orders for Scott-Ts add significant cost to the existing digital-to-synchro devices.

It is therefore desirable to make a digital-to-synchro converter unit that—as compared with current products in the market—is characterized by lower production costs, similarly compact dimensions, higher resolution, greater accuracy, and additional load-driving capability.

Literature instructive on synchros includes, for instance, the *Synchro/Resolver Conversion Handbook*, Fourth Edition, 1994, Library of Congress Catalog Number 74-77038, Data Device Corporation (DDC), 105 Wilbur Place, Bohemia, New York (electronic version, 125 pages, available in pdf at the DDC website).

Incorporated herein by reference is U.S. patent application publication 2011/0037627 A1, entitled "Modular Units for Synchro-to-Digital Conversion and Digital-To-Synchro Conversion," published 17 Feb. 2011, application Ser. No. 12/916,020, filed 29 Oct. 2010, inventor Charles J. Hermann.

SUMMARY OF THE INVENTION

In view of the foregoing, it is an object of the present invention to provide an improved methodology for effecting communication between a digital (e.g., computer) device and a synchro device, whereby digital information from the digital device is converted to analog information that is suitable for use by the synchro device.

In accordance with typical practice of the present invention, a digital-to-synchro conversion device comprises a computer, a digital-to-analog conversion device, a current-to-voltage conversion device, and a transformer device. The computer processes angularly indicative digital input and has resident in its memory a mathematical algorithm for converting the angularly indicative digital input to angularly radian digital output. The angularly radian digital output includes a computer-generated synchro digital signal S1 and a computer-generated synchro digital signal S2. The signal S1 represents [V Sin($\omega$t) Sin($\Phi$)]. The signal S2 represents [V Sin($\omega$t) Sin($\Phi$+120)].

The digital-to-analog conversion device converts the computer-generated synchro digital signal S1 to a synchro analog signal S1 current, and converts the computer-generated synchro digital signal S2 to a synchro analog signal S2 current. The current-to-voltage conversion device converts the synchro analog signal S1 current to a synchro analog signal S1 voltage, and converts the synchro analog signal S2 current to a synchro analog signal S2 voltage.

The transformer device transforms the synchro analog signal S1 voltage and the synchro analog signal S2 voltage to: a transformed synchro analog signal S1 voltage; a transformed synchro analog signal S2 voltage; and, a synchro analog signal S3 voltage. The signal S3 represents [V Sin($\omega$t) Sin($\Phi$+240)]. The synchro analog signal S3 voltage represents the average of the transformed synchro analog signal S1 voltage plus the transformed synchro analog signal S2 voltage.

The present invention's digital-to-synchro converter (DSC), as typically embodied, is designed to convert parallel 10-to-16 bits value (e.g., 10, 12, 14, or 16 bits resolution) to an analog synchro signal. The inventive DSC device is a "hybrid" in the sense that it has digital electronics in part, and analog electronics in part. In contrast, a conventional DSC device has analog electronics in its entirety. The present invention can be embodied, for instance, to provide 16-bits accuracy and 110 VAC range.

The present invention's DSC unit uniquely features a modern, digital design, as distinguished from an old-fashioned, analog design such as seen in currently available DSC units. In particular, the inventive DSC device uniquely features a math algorithm, written for a computer (e.g., a microcontroller), to generate a precise analog signal in conjunction with special hardware. According to typical inventive practice the computer is a microcontroller, typically embodied as a single chip including a processor (e.g., CPU), non-volatile memory for computer program/software (e.g., ROM or flash), volatile memory for input and output (e.g., RAM), a clock, and an I/O control unit.

Inventive products can surpass existing commercial products in terms of superior performance, reasonable price, acute precision, and on-demand availability. A typical embodiment of an inventive DSC: has about the same length and width as have currently available devices; uses timer interrupts to perform routine tasks, floating-point calculations, and input/output processes; supports 60 Hz and 400 Hz synchro generations up to 90 VAC; is capable of receiving input over an SPI bus as well as 10-16 bits parallel input; offers 10-16 bits (e.g., 10/12/14/16 bits) input values selection, and thus is more versatile than devices offering 14 bits input value; can be manufactured using off-the-shelf parts and components, thus affording benefits in cost-effectiveness and design robustness; offers 10 VA load capability (versus currently available 4 VA capability) without compromising price, accuracy, and performance; can provide automatic overload and overheat shutdown functions to prevent damage; has interface (e.g., with Ethernet) capability.

The present inventor believes that his non-implementation of a Scott-T transformer represents a breakthrough in the industry. Scott-T transformers are normally expensive devices, and nowadays may cost around $400 or $500. The present invention's elimination of a Scott-T transformer, in and of itself, represents significant economic savings. The present invention disproves the conventional wisdom that every resolver or synchro device must use a "Scott-T" transformer. The present invention succeeds in utilizing a regular, inexpensive transformer (e.g., a transformer having a single winding) to generate high voltage synchro signals. Typical inventive practice uses an advanced digital-signal-processing mathematical algorithm, a microcontroller, and a multiplying digital-to-analog converter (e.g., two MDAC components) to accomplish functionality that is equivalent to that of a Scott-T transformer.

BRIEF DESCRIPTION OF THE DRAWINGS

The present invention will now be described, by way of example, with reference to the accompanying drawings, wherein:

FIG. 7 is a diagram paralleling FIG. 4 and similarly illustrating typical practice of the present invention.

FIG. 10 is an integer representation by a microprocessor of a 270-degree-angle bit pattern input from a computer/encoder.

DESCRIPTION OF EXEMPLARY EMBODIMENTS OF THE INVENTION

Figure 1:
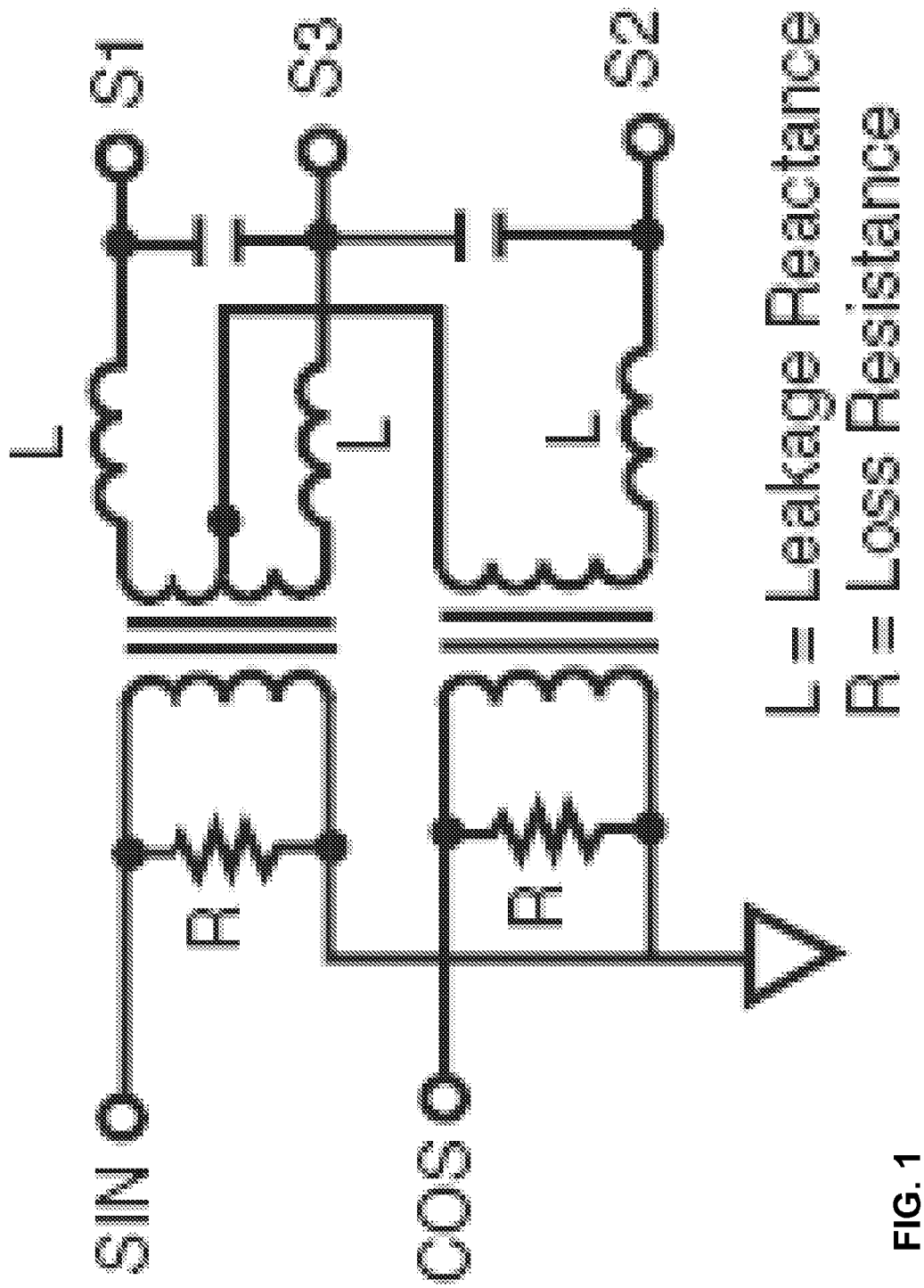
FIG. 1 is a diagram of a Scott-T transformer used in a commercially available digital-to-synchro conversion unit, such as a digital-to-synchro conversion unit manufactured by DDC and CCC.
Figure 2:
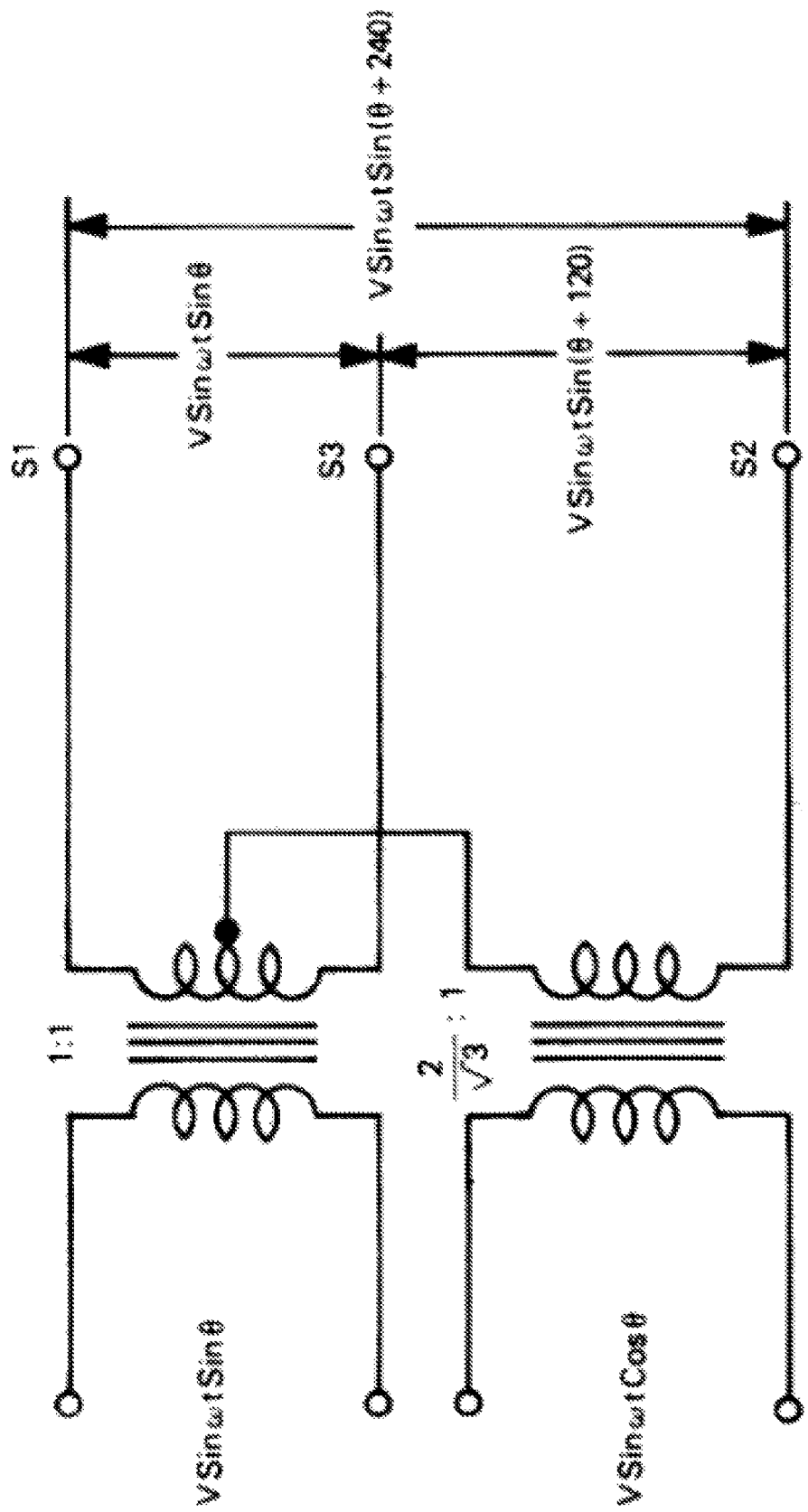
FIG. 2 is a diagram illustrating the synchro signals to or from a Scott-T transformer. The input and output synchro signals are generated by a commercially available digital-to-synchro conversion unit, such as one that is manufactured by DDC or CCC.

An important distinction between the inventive digital-to-synchro conversion device and traditional digital-to-synchro conversion devices is that the inventive device does not use a "Scott-T" transformer, a type of circuit such as illustrated in FIGS. 1 and 2. FIG. 2 is a simplified digital-to-synchro circuit diagram taken from the aforementioned DDC Synchro/Resolver Conversion Handbook, 4th Edition, page 47.

Commercially available digital-to-synchro conversion units use a Scott-T transformer exclusively. As shown in FIGS. 1 and 2, according to traditional principles of a Scott-T transformer, its secondary coil windings convert [V Sin($\omega$t) Sin($\Phi$)] and [V Sin($\omega$t) Cos($\Phi$)], which are input to the primary coil. The Scott-T transformer outputs [V Sin($\omega$t) Sin($\Phi$)], [V Sin($\omega$t) Sin($\Phi$+120)], and [V Sin($\omega$t) Sin($\Phi$+240)] as S1, S2, and S3 synchro signals.

FIGS. 1 and 2 illustrate the mathematics of the signals generated by existing DSCUs (e.g., DDC and CCC digital-to-synchro modules), which use a Scott-T transformer. The Scott-T transformer of conventional practice receives input signals that differ from those that are received by the power transformers of inventive practice. As shown in FIGS. 1 and 2, the Scott-T transformer receives [V Sin($\omega$t) Sin($\Phi$)] and [V Sin($\omega$t) Cos($\Phi$)]. The secondary windings of the Scott-T transformer are depicted on the right-hand side of FIG. 2. Specific turn ratios and a different center tap cause a phase shift to occur after this input. The Scott-T transformer will then output synchro signals S1, S2, and S3. The exact manufacturing specifications of Scott-T transformers render them very costly to produce.

Figure 3:
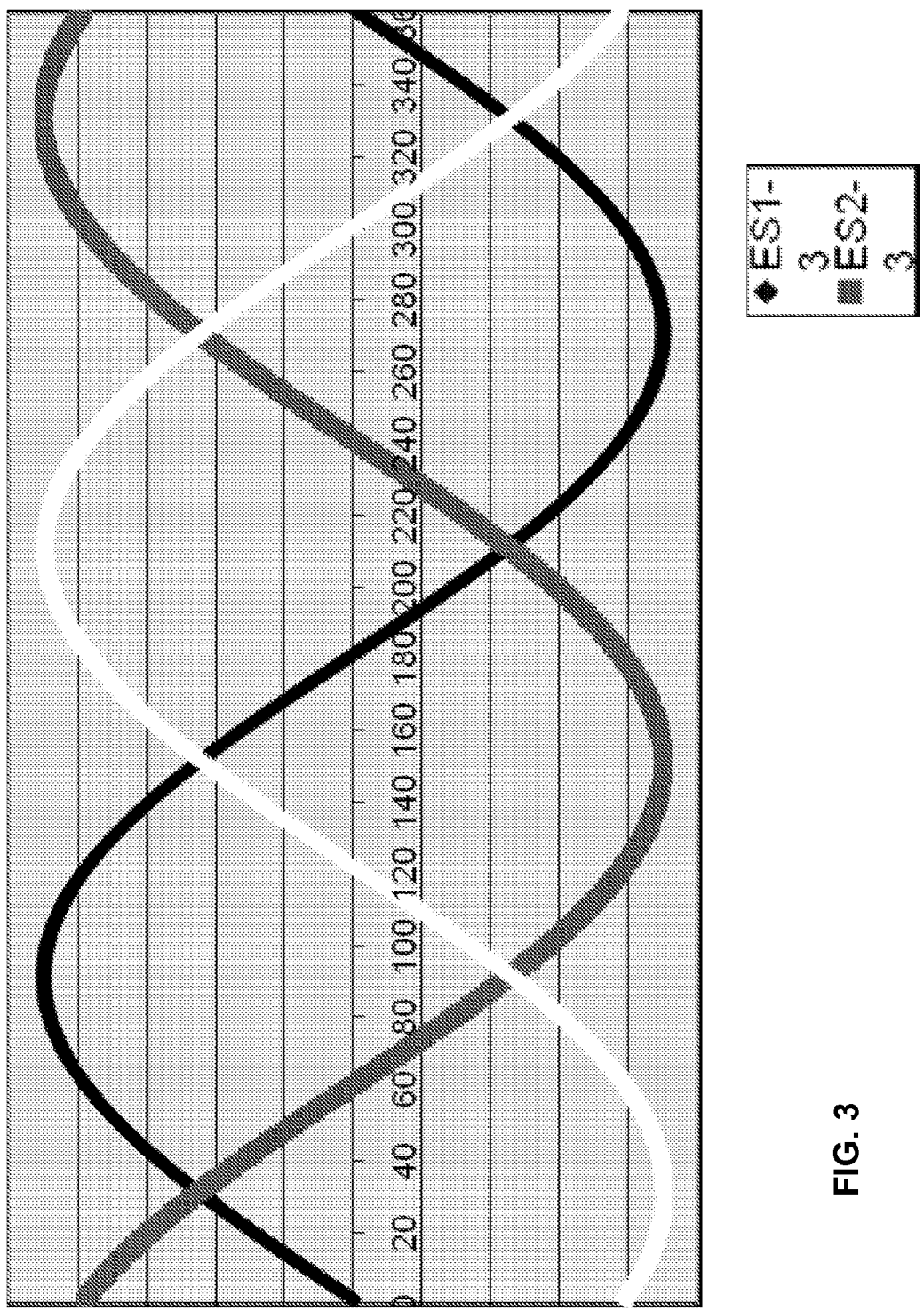
FIG. 3 is a graph illustrating the different amplitudes corresponding to the S1, S2, and S3 signals.

With reference to FIG. 3, a 14-bit digital-to-synchro block generates three sinusoidal signals ranging between 0V and 90V AC. These signals are amplified with the help of an operational amplifier, and are later fed to pumps or motors. This logic is applied to most synchro-based applications and devices, and usually implements synchro-to-digital conversion circuitry and/or digital-to-synchro conversion circuitry. The general synchro waveform of FIG. 3 illustrates how an amplitude difference varies based on desired angle.

The prevailing wisdom is that synchro signals cannot be generated in the absence of a Scott-T transformer. In contravention of the prevailing wisdom, the present invention dispenses with a Scott-T transformer and duplicates the role of a Scott-T transformer by generating an exact mathematical model using digital electronics. Inventive practice uniquely features a computer, a computer program product resident therein, and other electronics as representing a functional equivalent of a Scott-T transformer.

Now referring to FIGS. 4 through 11, typical inventive practice eliminates a Scott-T transformer and replaces its functionality with an advanced microcontroller 100, a multiplying digital-to-analog converter (MDAC) 200, and a digital-signal-processing math algorithm 1000. FIGS. 4, 7, 8, and 9 exhibit the hardware and logic of a typical inventive DSCU circuit, which differs markedly from the traditional designs depicted in FIGS. 1 and 2. The traditional designs employ a Scott-T Transformer, which usually is expensive and complicated. In contrast, a typical inventive design uses inexpensive power transformers that are capable of delivering twice the amount of current.

Figure 7A:
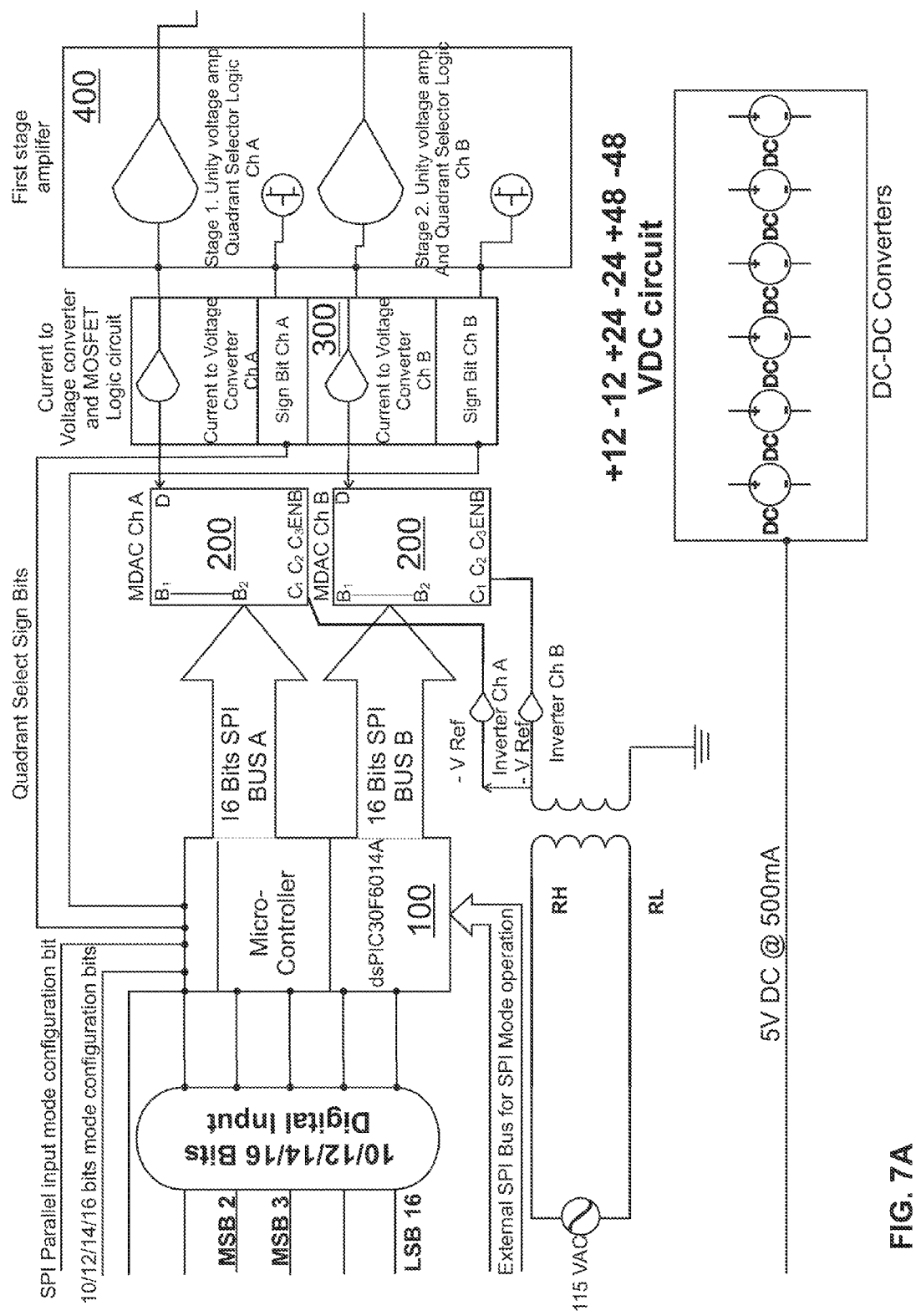
FIGS. 7A and 7B show enlarged (left and right-hand) portions of FIG. 7.
Figure 7B:
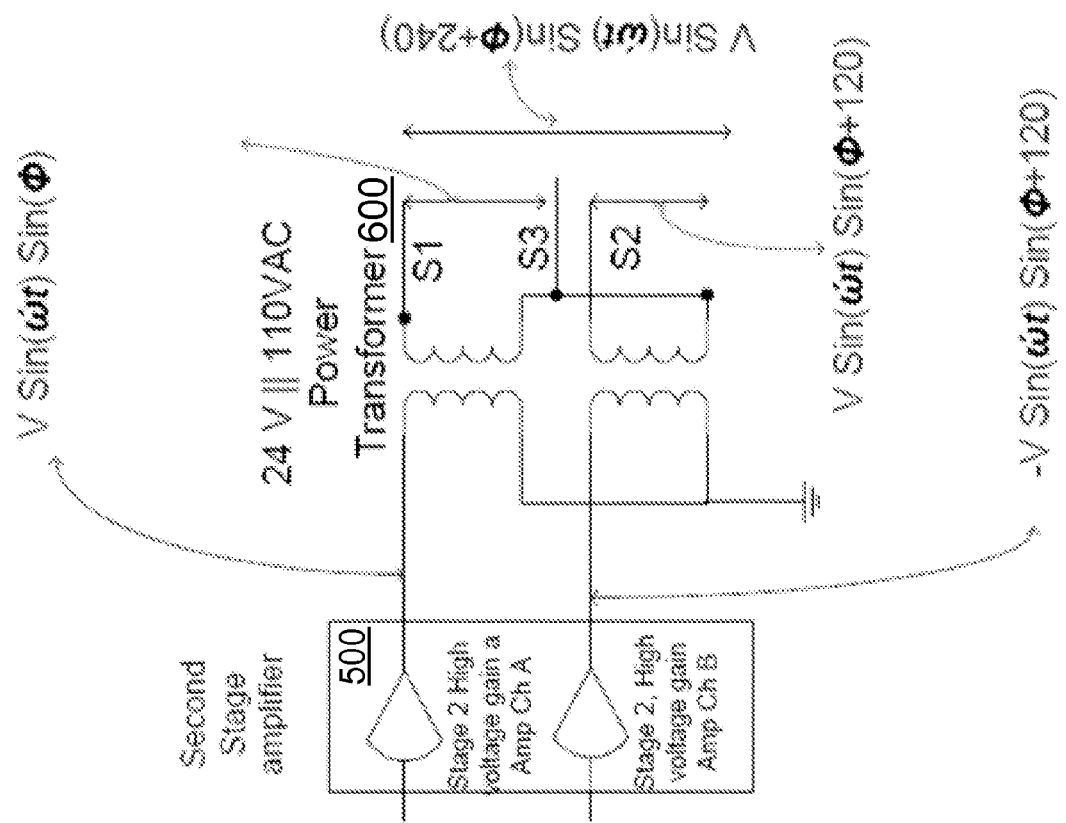
Figure 8:
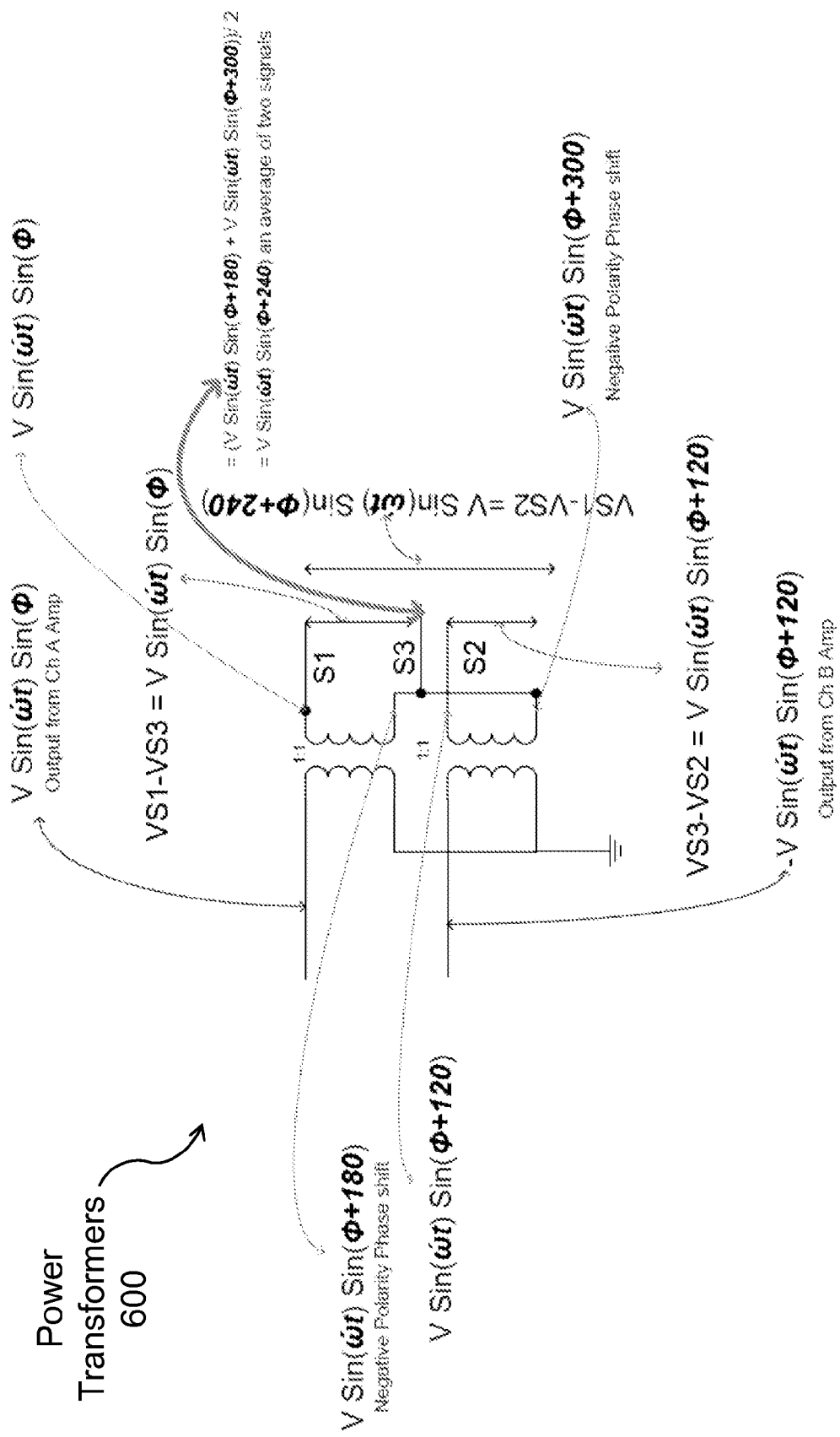
FIG. 8 is a diagram paralleling FIG. 7B and similarly illustrating typical practice of the present invention.
Figure 9:
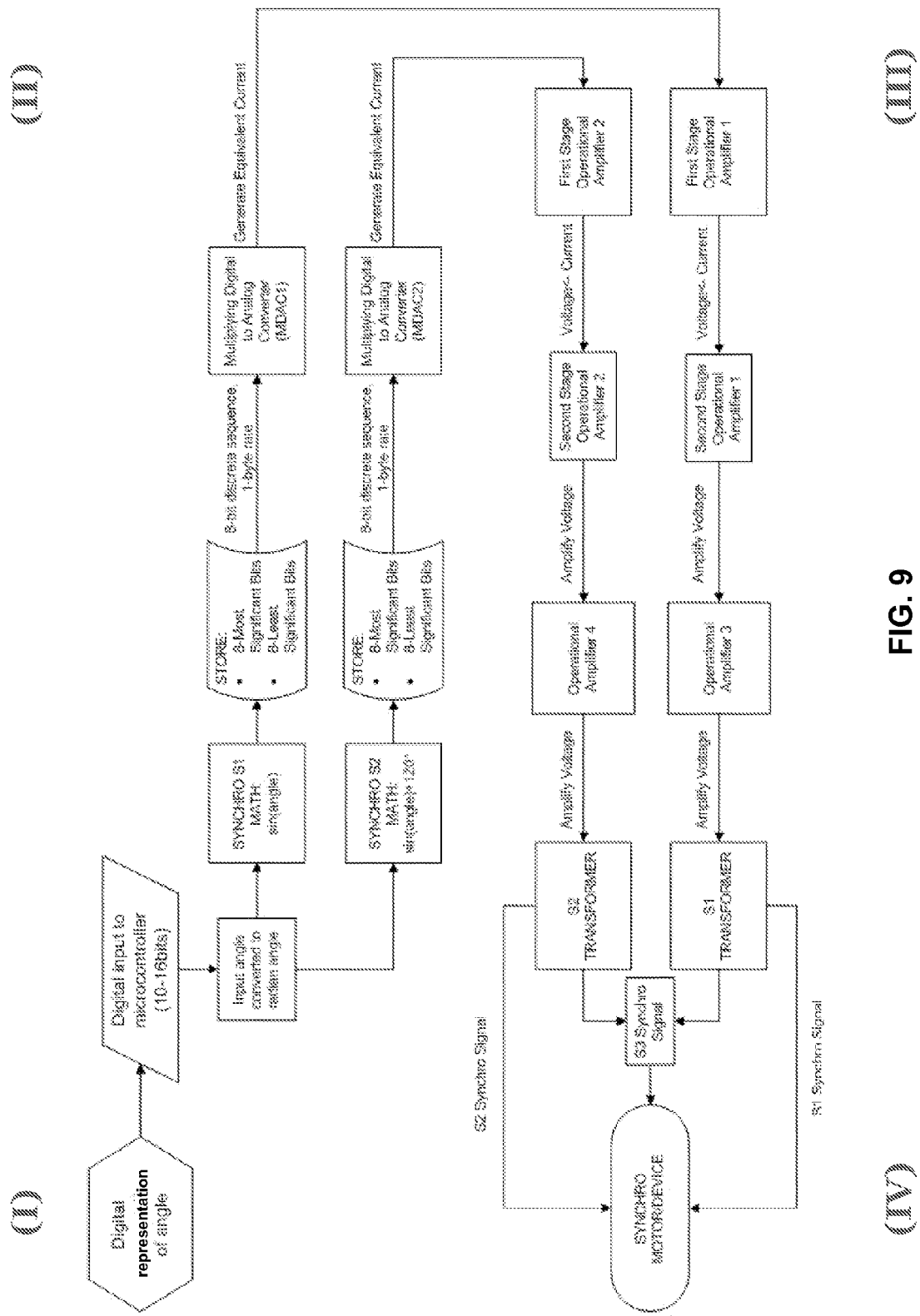
FIG. 9 is a diagram illustrating typical practice of a mathematical algorithm in accordance with the present invention.
Figure 9A:
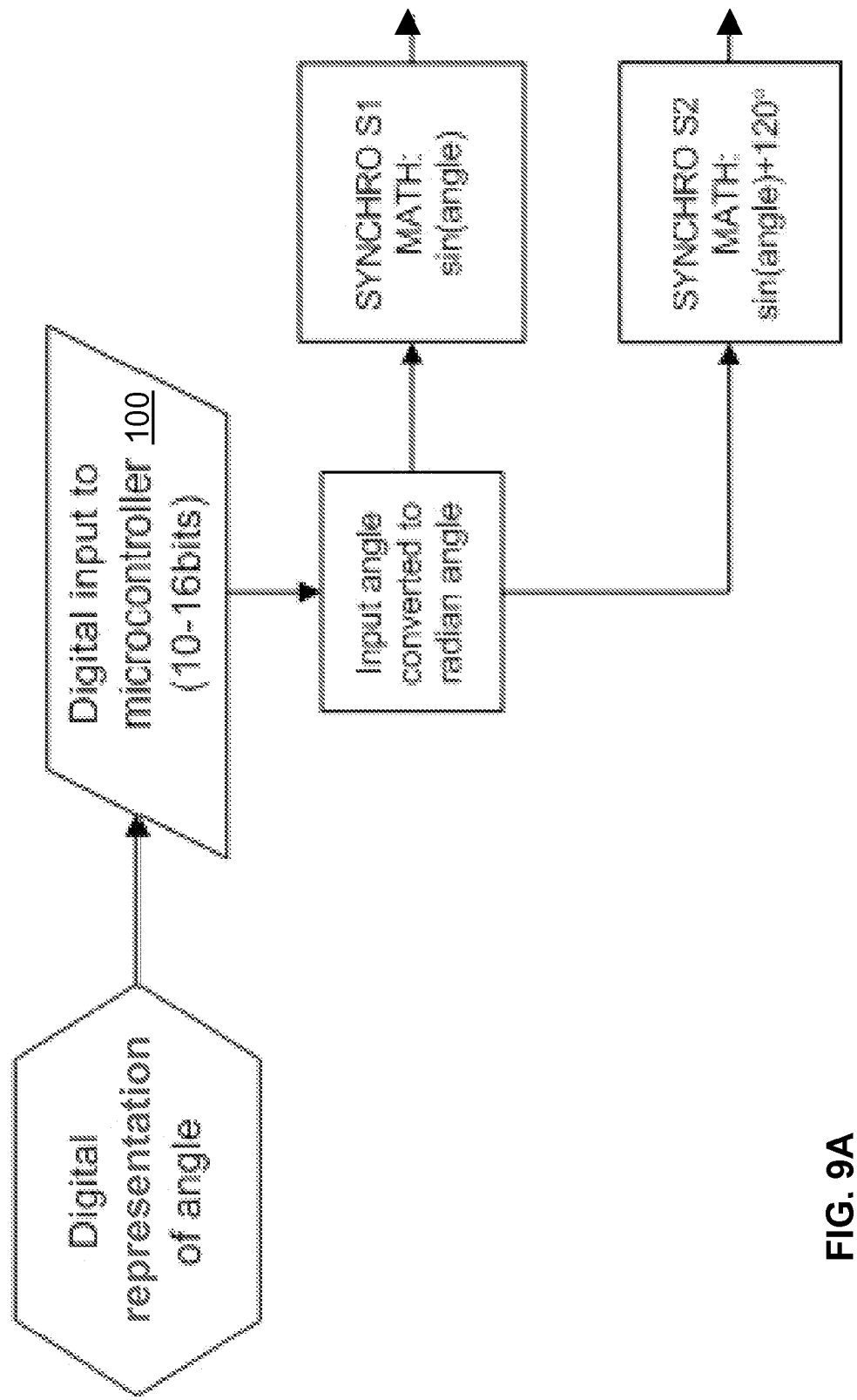
FIGS. 9A, 9B, 9C, and 9D show enlarged quadrantal portions of FIG. 9.
Figure 9B:
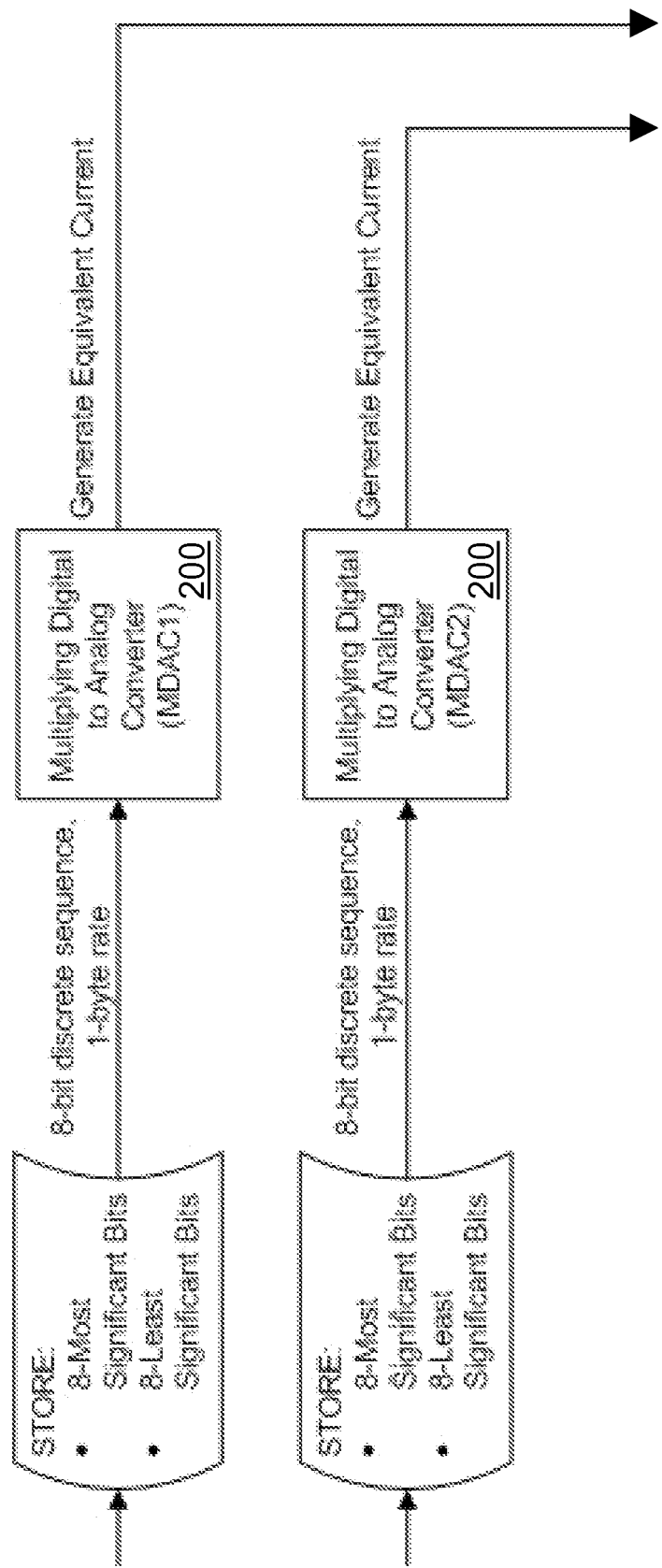
Figure 9C:
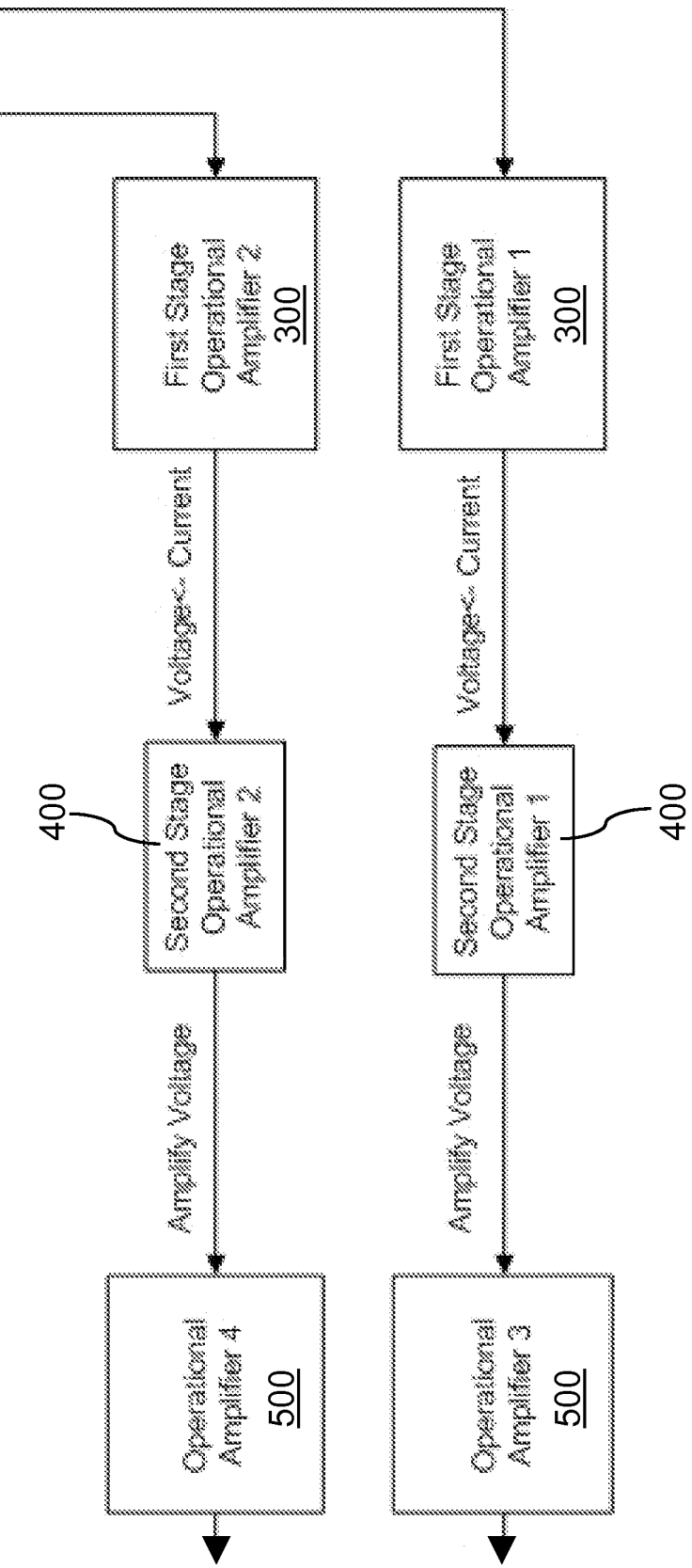
Figure 9D:
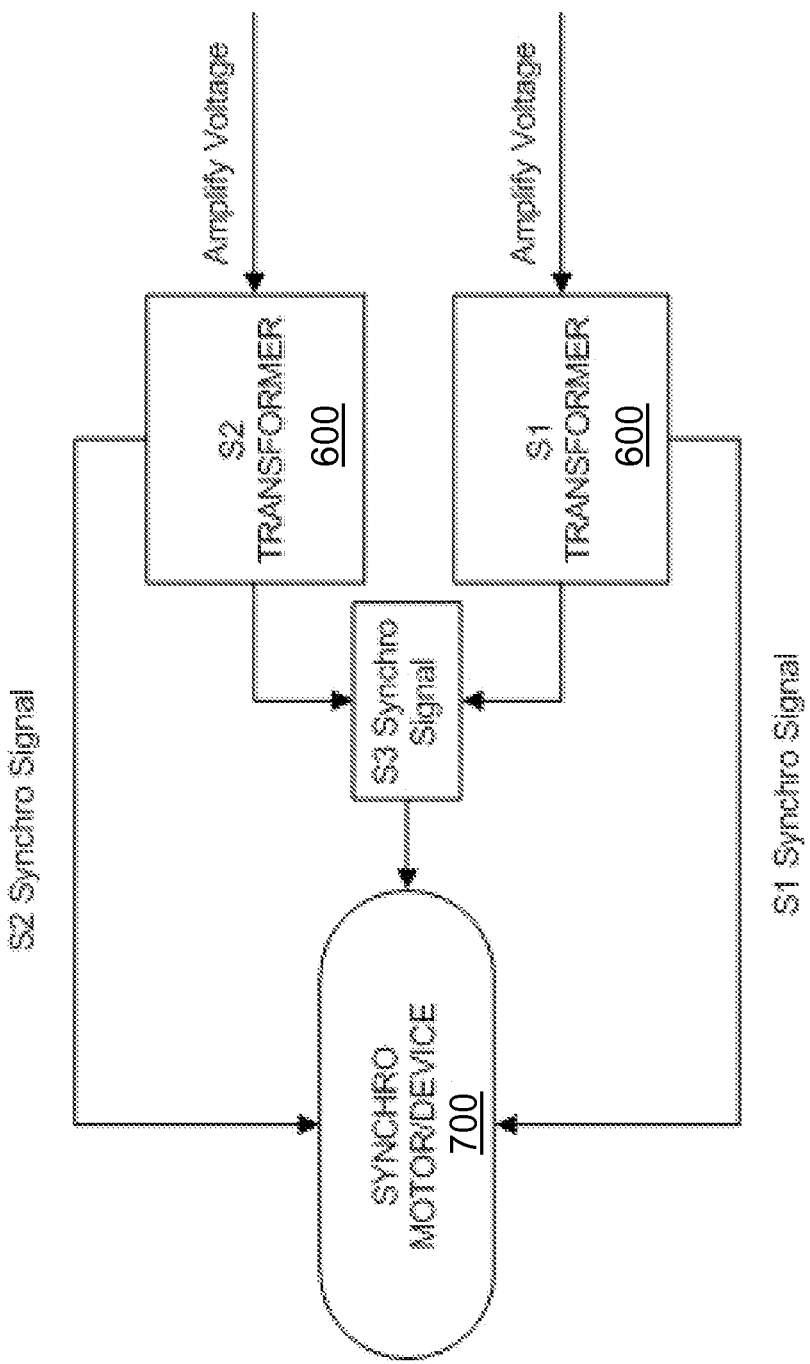

Typical inventive practice of a transformation of synchro signals from the primary coil to the secondary coil of a power transformer is shown in FIGS. 7B and 8. According to typical inventive practice, input signals [V Sin($\omega$t) Sin($\Phi$)] and [−V Sin($\omega$t) Sin($\Phi$+120)] are applied to two power transformers 600. The same synchro output is generated from the two power transformers 600 as is generated from the Scott-T transformer, viz., synchro signals S1, S2, and S3. The present invention's power transformers 600 generate synchro signals S1, S2, and S3 using a microcomputer 100 having a mathematical algorithm 1000 resident therein, two digital-to-analog converters 200, and relay switches 800. By comparison, a Scott-T transformer implements specific turn ratios in its coils to produce the same output. Hence, the present invention's two power transformers, along with digital software capability, serve the same function as a Scott-T transformer, viz., the generation of synchro signals S1, S2, and S3.

The present inventor found that when using regular power transformers, which do not perform any phase shifts, signals are amplified in an amplitude range between 0V and 90V. As shown in FIG. 7, external circuits will set configuration bits to select 10/12/14/16 bits input mode by setting "input mode selector pins" at 00 or 01, or 10 or 11 binary value. Then, SPI/Parallel bit will be set to 0 for parallel mode and 1 for SPI mode. If the user sets this pin to 1, the SPI mode will expect 10/12/14/16 bits inputs over the SPI bus to the microcontroller. If the user sets to this pin to 0, it will accept inputs via 10/12/14/16 bits pins as per the "input mode selector pins" setting.

The received value will be converted to a floating-point data type and will be fed to an internal math algorithm, which will generate 16 bits equivalent data to input to both MDAC ICs. The dsPIC and math algorithm will together generate two different 16-bit values for [V Sin($\omega$t) Sin($\Phi$)] and [V Sin($\omega$t) Sin($\Phi$+120)], which will be fed to the power transformers. The MDACs generate two separate currents with resolution in mA (equivalent to received 16 bits value), which is later converted to a voltage by using a current-to-voltage converter.

A DAC sign bit signal, which is generated by the microcontroller after performing a math operation over a desired angle value, is fed to a unity gain amplifier 400 to change the phase of both small voltage AC signals. The phase shift is determined by two bits value ($2^2$=4 quadrants). These signals [V Sin($\omega$t) Sin($\Phi$)] and [V Sin($\omega$t) Sin($\Phi$+120)] are sent to a second stage amplifier 500 to amplify signals to a 24V amplitude range. These amplified signals are fed to primary coils of both transformers 600, whose secondary coils are tied to a common end.

According to a typical embodiment of the present invention, the mathematical algorithm is programmed and compiled in C for a dsPIC30F6014A microcontroller. This computer code works in conjunction with the hardware to effect a new approach to generating synchro signals. All components of a typical inventive DSC unit are relatively inexpensive, as they are readily acquired from an electronic components distributor. The commercial availability of the components that can be utilized for inventive practice also fosters reliability, speed, and precision of an inventive DSC unit, as compared with existing DSC units.

Figure 11:
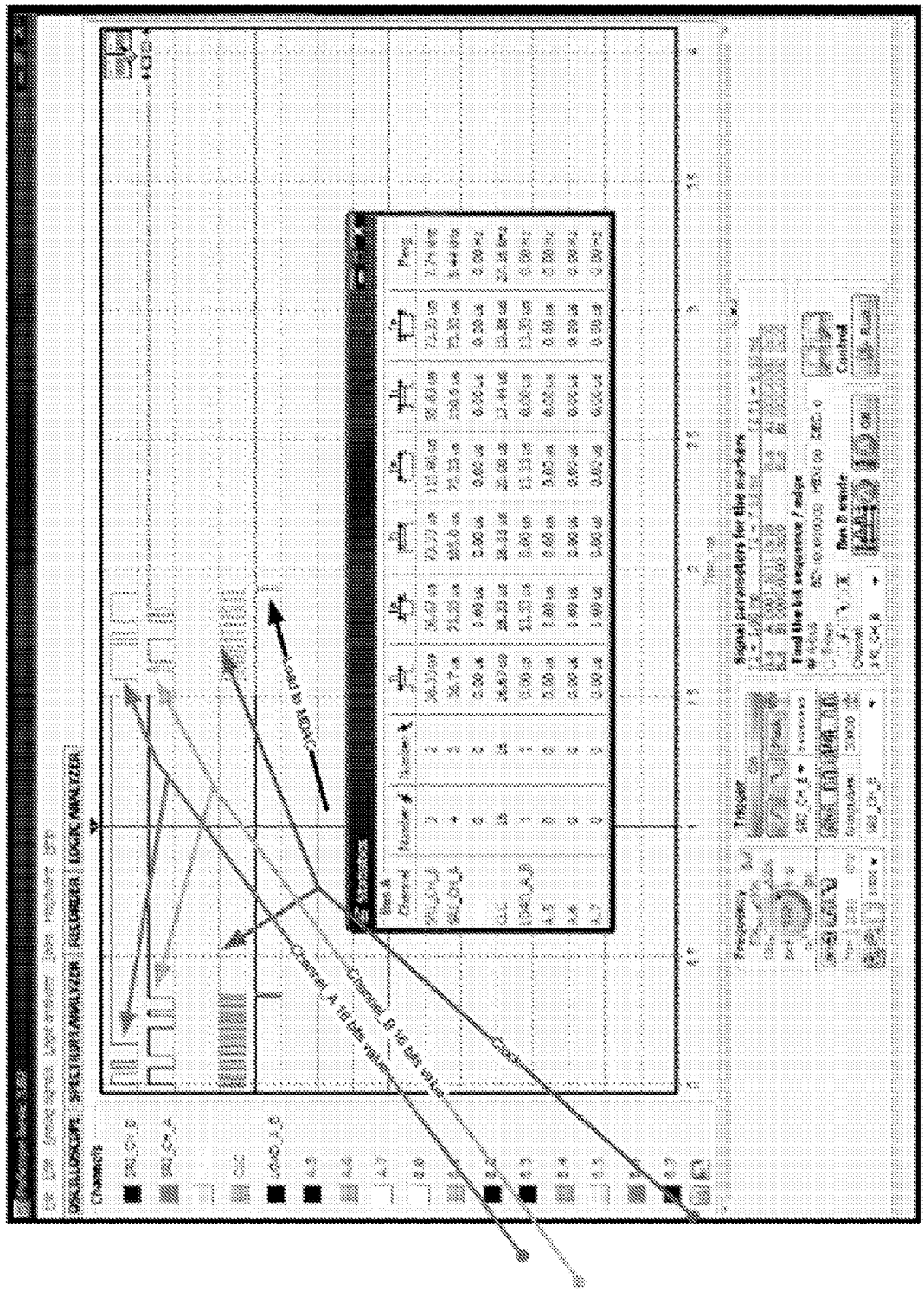
FIG. 11 is a computer screenshot of an embodiment of 16-bit practice in accordance with the present invention.

An example of operation of an inventive device on 16 bits resolution is shown in FIG. 11. As depicted in FIG. 11, 16 clock pulses are generated by the microcontroller to send 16 bits values of [V Sin($\omega$t) Sin($\Phi$)] over channel A of the MDAC and [V Sin($\omega$t) Sin($\Phi$+120)] over channel B of the MDAC. These 16 bits values are generated by the present invention's dsPIC microcontroller's math algorithm and then released bit by bit on every clock pulse to the MDAC as per MDAC clock specification. Maintaining strict timing between the MDAC and the dsPIC controller is very important. According to the synchro signals transformation in a typical hybrid DSCU according to the present invention, V Sin($\omega$t) Sin($\Phi$) is output from Ch A. Amp-V Sin($\omega$t) Sin($\Phi$+120) is output from Ch B. AmpV Sin($\omega$t) Sin($\Phi$+120)VS1−VS2=V Sin($\omega$t) Sin($\Phi$+240)V Sin($\omega$t) Sin($\Phi$)VS1−VS3=VS3−VS2=V Sin.

Figure 5:
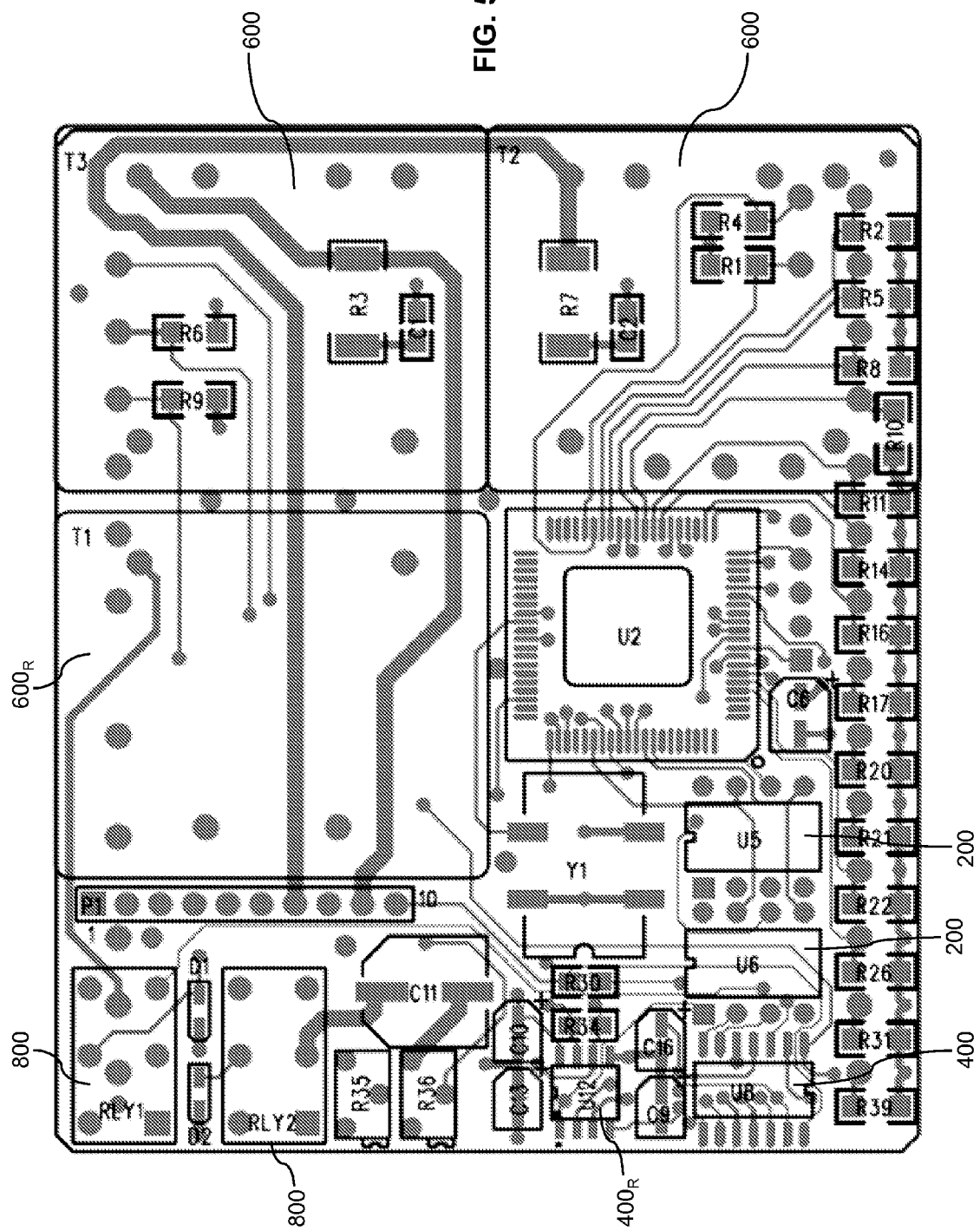
FIGS. 5 and 6 are the circuit boards of a prototypical embodiment of the present invention.

Particularly with reference to FIGS. 7B and 8, the present inventor obviates a Scott-T transformer and succeeds in generating an analog signal that can be fed to a regular power transformer device to obtain S1, S2, and S3 signals. The amplifiers generate two analog signals, viz., [V Sin($\omega$t) Sin($\Phi$)] and [V Sin($\omega$t) Sin($\Phi$+120)]. The power transformer device includes two power transformers 600. As shown in FIG. 5, the power transformer device includes a reference power transformer $600_R$, in addition to the two step-up power transformers 600. FIG. 8 reveals that a basic 1:1 turn ratio will put the same amount of energy in an amplified signal on the respective secondary coils of the two power transformers 600. Connecting the negative polarities of the two transformer 600s' secondary coils creates a third signal (S3), which is an average of both the S1 and S2 signals.

By way of elaboration, the S3 voltage results from a phase-shift summation of the S1 and S2 voltages. More specifically, the S3 voltage is formed as an arithmetic-mean-type average of the S1 and S2 voltages. S1 is represented by sin($\phi$). S2 is represented by Sin($\Phi$+120). S3 is represented by Sin($\Phi$+240). According to typical inventive practice, the occurrence of the phase shift of 240 degrees is associated with the nature of a standard power transformer as used in a step-up configuration. The transformers 600 are an S1 transformer 600 and an S2 transformer 600. Each transformer 600 has two output pins. The 51 transformer's first output pin has a 1:1 ratio, outputting an amplified voltage of the signal (Sin($\Phi$)). The S1 transformer's second output pin outputs a 180 degree phase-shifted value, viz., Sin($\Phi$+180). The S2 transformer's first output pin has a 1:1 ratio, outputting an amplified voltage of the signal (Sin($\Phi$+120)). The S2 transformer's second pin outputs a 180 degree phase-shifted value, viz., (Sin($\Phi$+120+180))=(Sin($\Phi$+300)). Taking the sum of the S1 transformer's second output pin and the S2 transformer's second output pin, this yields (Sin($\Phi$+180))+(Sin($\Phi$+300))=(Sin($\Phi$+480)). Taking the average of the S1 transformer's second output pin and the S2 transformer's second output pin, this yields (Sin($\Phi$+480))/2=Sin($\Phi$+240)=S3 voltage.

Among the notable features of the present invention is the generation, by an integrated circuit, of analog signals [V Sin($\omega$t) Sin($\Phi$)] and [V Sin($\omega$t) Sin($\Phi$+120)]. According to typical inventive practice, multiplying digital-to-analog converter (multiplying DAC, or MDAC) logic performs this operation. Various types of MDACs that are suitable for inventive practice are commercially available at low costs. To test his invention, the present inventor selected the LTC1595N as the MDAC to perform this operation. This integrated circuit takes 16 bits of digital value over SPI and generates current (in milliamps) per 16 bits value, as well as a reference signal.

Figure 6:
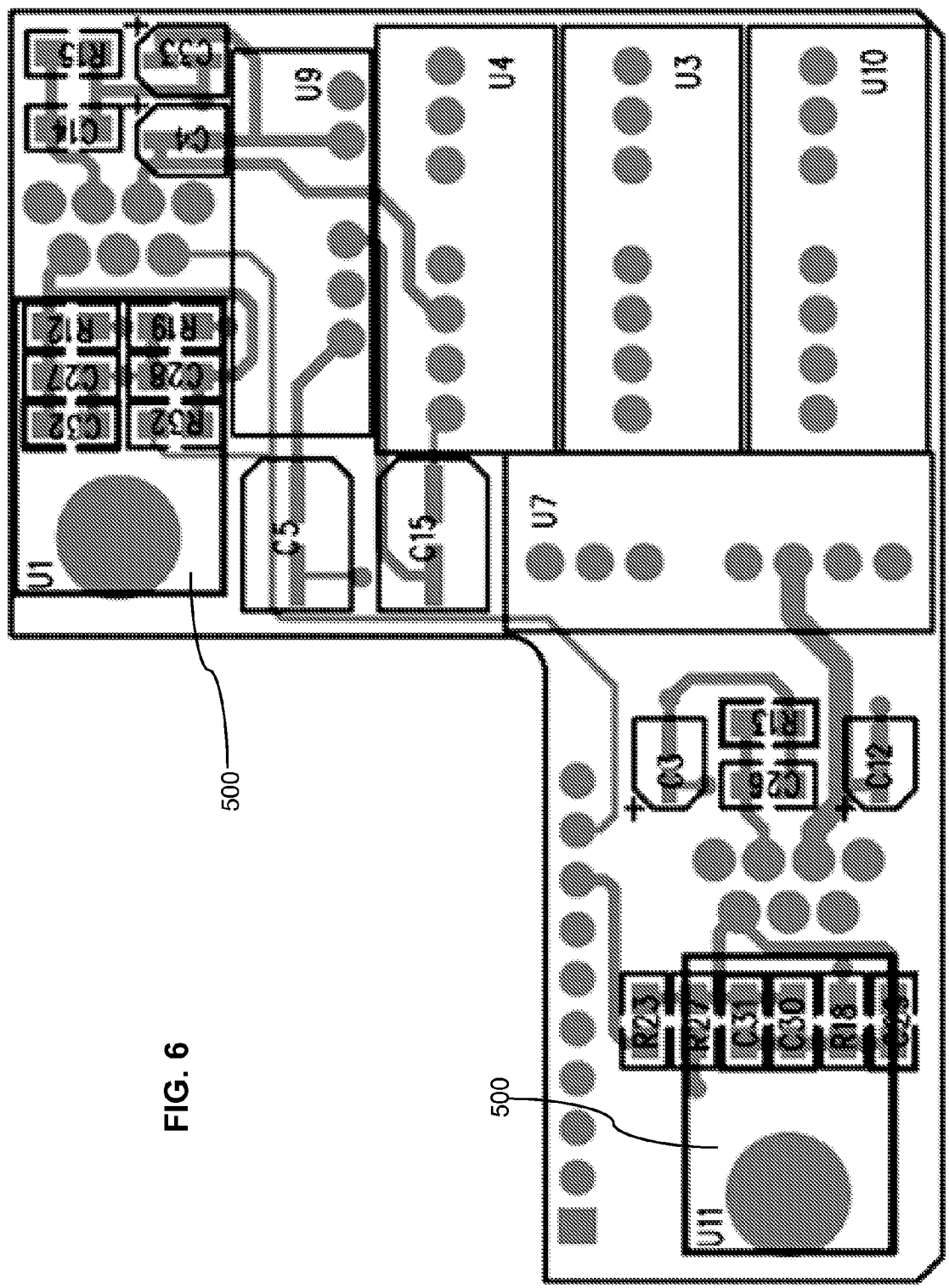

A working model of the present invention was implemented on a breadboard, similarly as shown in FIGS. 5 and 6. The inventive test model is shown in FIGS. 5 and 6 to include a microcontroller 100, two multiplying analog-to-digital converters 200, a first-stage operational amplifier 400, a reference voltage amplifier 400$_R$, two second-stage operational amplifiers 500, a reference power transformer 600$_R$, two step-up transformers (S1, S2, S3) 600, and two mechanical relays 800. Using the LTC1595N chip, the inventive test model implemented simulation software to generate a small AC signal without any phase shift or delay from a 120 VAC source. The inventive test model also implemented a small power transformer with minimum output impedance. A 16-bit value clock and load signals were input to the MDAC, but these could not be simulated because of the dearth of simulation models commercially available for this integrated circuit (IC). The dsPIC30F6014A microcontroller was implemented for digital signal processing.

Figure 4:
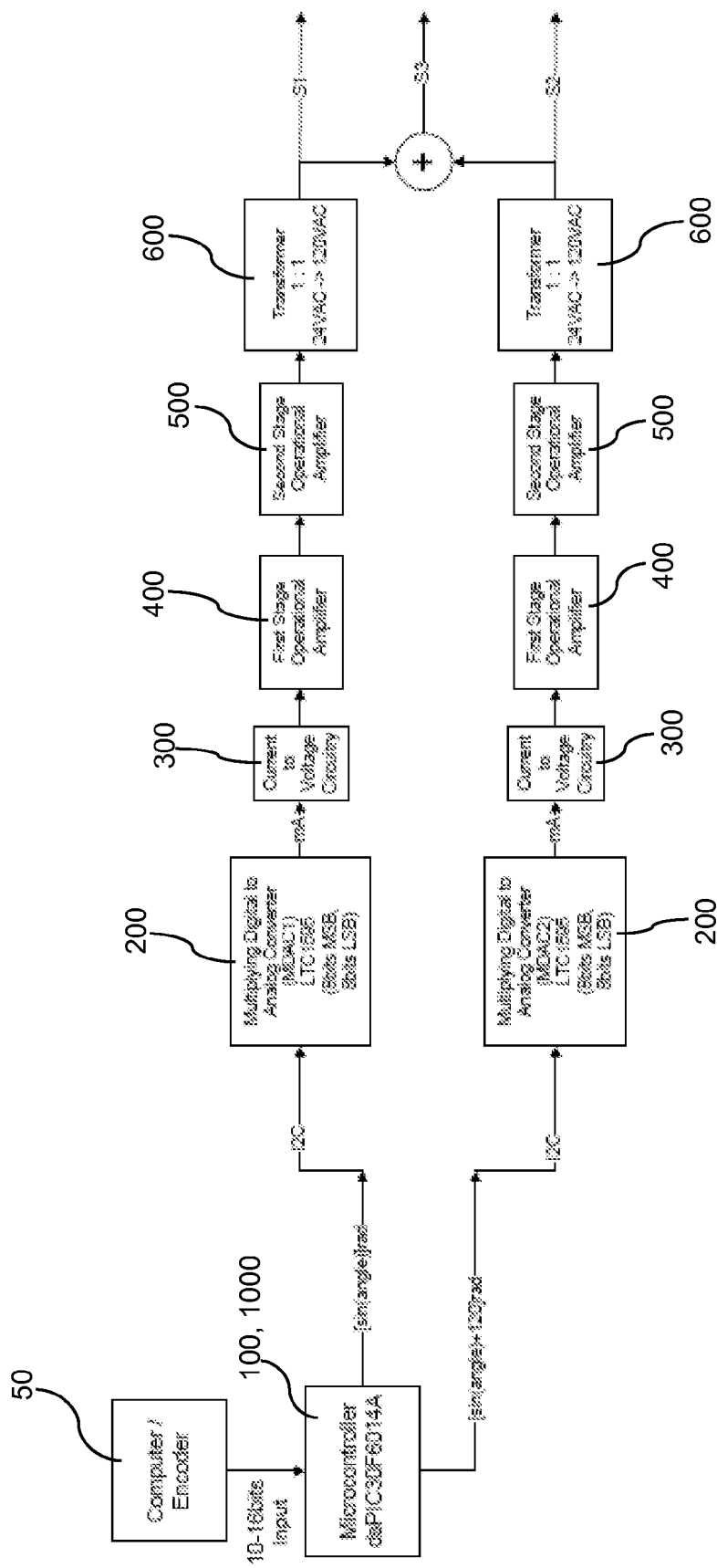
FIG. 4 is a diagram illustrating typical practice of the present invention.
Figure 4A:
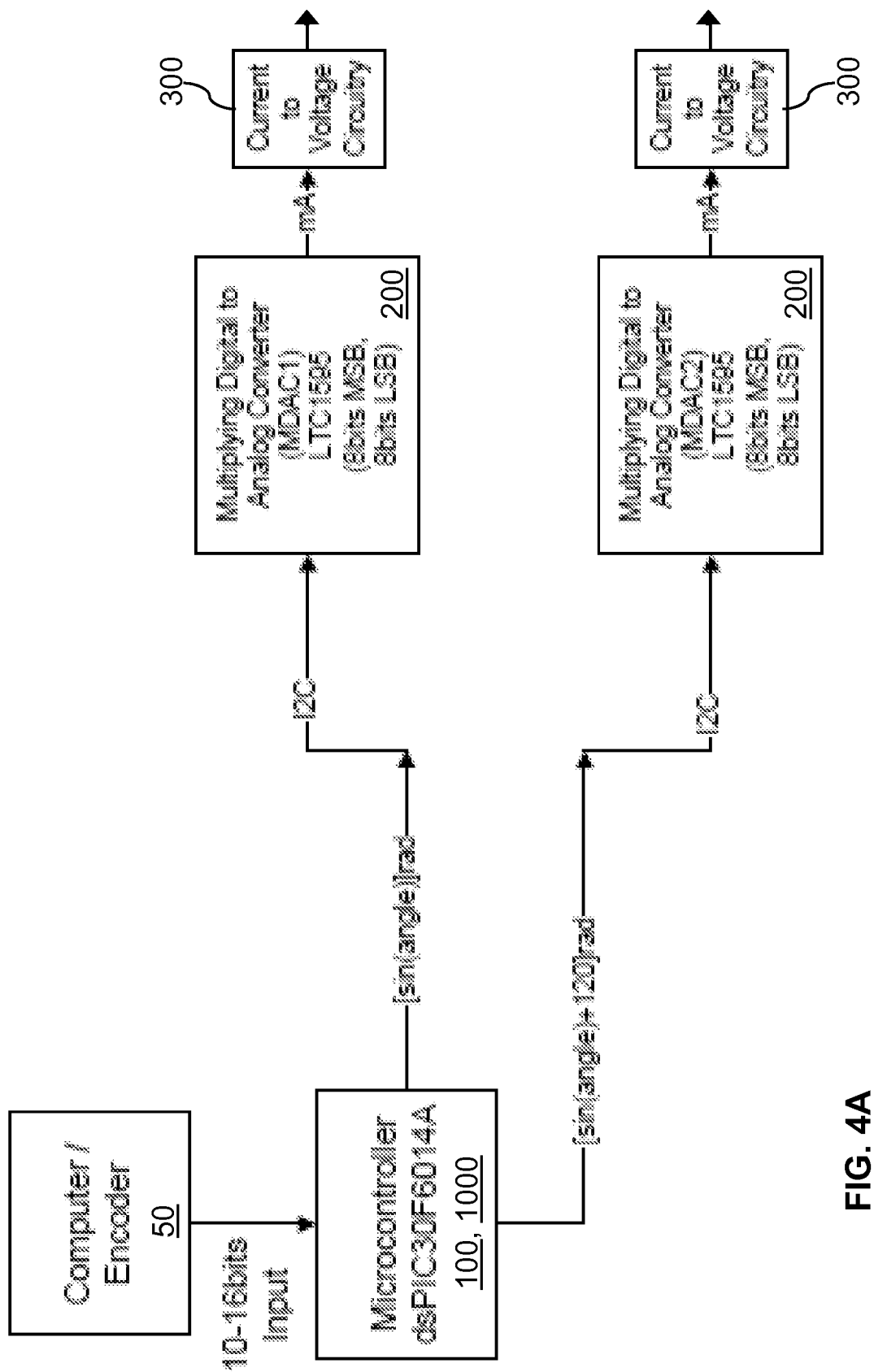
FIGS. 4A and 4B show enlarged (left-hand and right-hand) portions of FIG. 4.
Figure 4B:
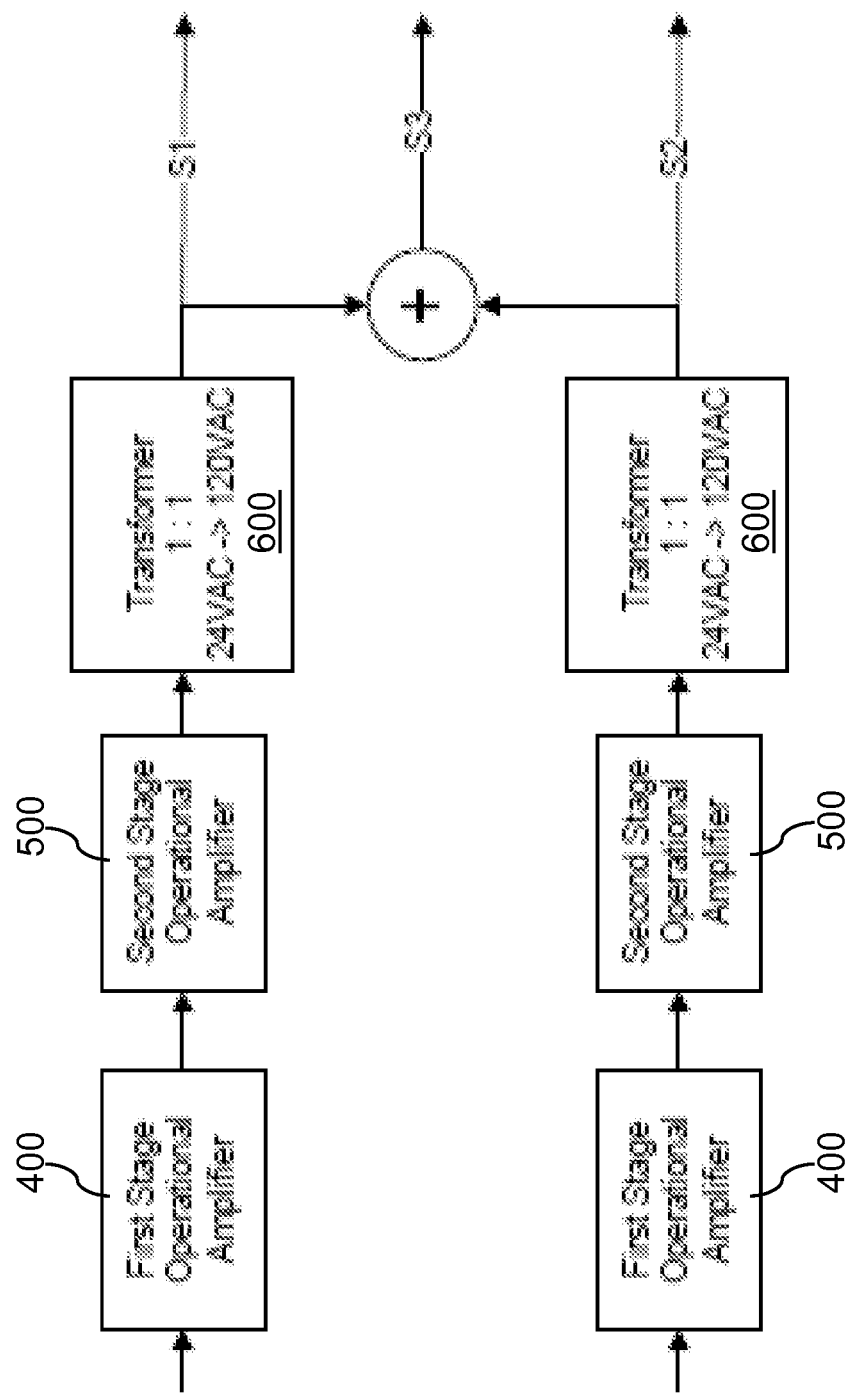

Referring in particular to FIGS. 4, 7, and 8, the inventive test model's microcontroller 100 held an important math algorithm, and was key to generating a 16-bit equivalent value for [V Sin($\omega$t) Sin($\Phi$)] and [V Sin($\omega$t) Sin($\Phi$+120)]. The 16-bit floating value of these signals was generated by this algorithm and fed into two separate MDACs 200. A very small, unique current was generated based on different 16-bit values, and was then fed to a current-to-voltage converter logic circuit 300. This logic generated an AC signal (measured in millivolts), with amplitude that changed for different angle values. The small AC signal was directed to both the inverting end and the non-inverting end of a unity gain amplifier 400. The sign bit signals (00=1st Quadrant; 01=2nd Quadrant; 10=3rd Quadrant; 11=4th Quadrant) played an important role in changing the phase of the signals. The phase changes of the signals created differences between all synchro signals. For instance, to rotate a rotor to a 270 degree angle, the voltage difference between S1-S3 must equal 90V, S2-S3=45V and S1-S2=45V.

Problems were encountered when implementing the inventive test design on the breadboard assembly, such as: managing to generate a dual polarity voltage using compact DC-DC converters while still generating enough current to drive amplifiers; achieving total cutoff of 2N7002 MOSFET (fast solid state open switch) without leaking current; and, having a complete drain of negative and positive voltage to ground. OPA 547 precision OPAMP were implemented in the test design to amplify the [V Sin($\omega$t) Sin($\Phi$)] and [V Sin($\omega$t) Sin($\Phi$+120)] prior to feeding to conventional transformers. Other challenges were encountered with respect to: trying to match input impedance; generating correct sign bits; keeping the size of the inventive DSCU to retrofit; managing heat absorption; and, redirecting EMI. The abovementioned issues were resolved over time in the laboratory.

The digital logic of the present invention's hybrid digital-to-synchro converter (HDSC) represents a significant improvement over traditional DSCs. The present invention's HDSC successfully mimics the functionality of a Scott-T transformer by using a mathematical algorithm, one or more microcontrollers having the mathematical algorithm resident in memory, digital-to-analog converters, and standard power transformers. The basic parts of a typical inventive embodiment are off-the-shelf parts and readily available. The present invention's HDSC hence can be a highly cost-competitive solution, with the final product costing as little as one-third of the cost of existing devices. Furthermore, an inventive device can be designed to have a footprint that matches that of existing DSCs, thereby facilitating integration into existing systems. Typical embodiments of the present invention are attributed with high resolution, clean signal processing, digital interfaces, and low cost.

According to typical inventive practice, a 16-bit microcontroller permits the inventive digital-to-synchro conversion device to process angles having a precision within a tenth of a degree, since it accepts high-resolution digital input ranging from 10 to 16 bits. Most existing DSCs have a 14-bit resolution, rendering angles that only have a range of precision within a few degrees. The present invention's digital components process digital angle data without interference from heat, radio frequencies, and noise—common problems in existing DSC units. The present invention, as typically embodied, processes converted analog signals using high-pass filters, and the synchro signals are generated by encapsulated transformers; these precautions ensure clean and non-distorted synchro signals.

A typical embodiment of an inventive DSC operates on both 60 Hz and 400 Hz frequencies, and generates three signals up to 90 VAC. Three different voltage values represent a unique angle; for instance, to move a motor at 270 degrees, the S1–S2 voltage difference should be 90 VAC, the S2–S3 voltage difference should be 45 VAC, and the S1–S3 voltage difference should be 45 VAC. Inventive practice involving larger transformers can drive loads that require up to perhaps 10 VA, such as gyro repeaters and other synchro motors. Furthermore, the present invention's digital interface accepts a direct serial connection to deliver angle data to the converter.

A key feature of inventive practice is the mathematical algorithm, resident in the memory of the microcontroller included in the inventive DSU. The microcontroller accepts a 10 to 16 bits value and converts it to an integer number.

For instance, let us assume that a computer requests an inventive digital synchro unit to rotate a motor to 270 degrees. The resultant bit pattern is sent to the inventive synchro block. The main algorithmic steps of typical inventive practice are described below.

Algorithmic Step One:

The microcontroller receives a bit pattern from a computer/encoder 50, and generates an integer representation of the angle that is 270 degrees, as shown in FIG. 10. Note that 180+90=270 degrees is represented in binary format by setting the first two MSBs to 1. If all of the above bits are set to 1, then the total sum of each bit's value will be 360 degrees. After the microcontroller receives the above bit pattern (270 degrees in this case), it calculates SIN(270*0.017453) and SIN((270+120)*0.017453), where "0.017" constant value converts angle to radians. In this case, SIN(170*0.017) generates a number for Synchro Signal S1=Sin(Theta) and Synchro Signal S2=Sin(Theta+120).

Algorithmic Step Two:

Generated values for S1=SIN(270*0.017453)=−0.99252 and S2=SIN((270+120)*0.017453)=0.339904 are calculated by the microcontroller.

Algorithmic Step Three:

Now the microcontroller multiplies −0.99252*0XFFFF=−65044.7982, where 0XFFFF (65535 in decimal) converts a SIN value of S1 (−0.99252) to 16 bit digital representation. Accordingly, a multiplication of −0.99252*0XFFFF results in 65044.7982, and it is represented back to hexadecimal value 0XFE14. The S1=0XFE14 signal is thus calculated. The same approach is taken for S2, in Algorithmic Step Four.

Algorithmic Step Four:

Now the microcontroller multiplies 0.339904*0XFFFF=22275, where 0XFFFF (65535 in decimal) converts a SIN value of S2 (0.339904) to 16 bit digital representation. Accordingly, a multiplication of 0.339904*0XFFFF results in 22275, and it is represented back to hexadecimal value 0x5703. The S2=0x5703 signal is thus calculated.

Algorithmic Step Five:

Based on the S1 and S2 signal values as calculated above, a relay (switch) for the S1 signals and a relay (switch) for the S2 signals are turned on or off by the microcontroller, to determine the quadrature of the signals.

Algorithmic Step Six:

Now the inventive mathematical algorithm breaks the 0xFE14 (decimal 65044) value into two 8-bit values, viz., 0xFE (decimal 254) and 0x14 (decimal 20). There are two multiplying digital-to-analog converters (MDACs) in the circuit; for purposes of this discussion, these two MDACs are referred to herein as the "first" MDAC and the "second" MDAC. The first MDAC is associated with the S1 signal, and the second MDAC is associated with the S2 signal. The first MDAC connects to the S1 signal and accepts these two 8-bit values (0xFE; 0x14) bit-by-bit from the microcontroller. The 0xFE value of the S1 signal leaves the microcontroller and goes to the first MDAC. Then, the 0x14 value of the S1 signal is sent to the same MDAC bit-by-bit. At this point the first MDAC holds two values, viz., 0xFE and 0x14. The first MDAC combines these values to form a single value, viz., 0xFE14. Based on this 0xFE14 value, the first MDAC generates a very small current output on pin 3, for instance, 27 ma (milliamp) in this example. This current value is unique for each S1 value sent to the first MDAC.

Algorithmic Step Seven:

Algorithmic Step Seven applies the operations of Algorithmic Step Six to the S2 signal. A value 0x5703 is broken into two 8-bit values. 0x57 (87 in decimal) and 0x03 (3 in decimal) values are sent to the second MDAC, which is assigned to and connected for the S2 signal. This MDAC receives 0x57 and 0x03 values and combines them to form a single value 0x5703. Based on this 0x5703 value, the second MDAC generates a small current that is unique for each value, for instance, 14 ma (milliamps) in this example.

Note that the present invention's mathematical algorithm, as typically embodied, includes Algorithmic Steps One through Seven. Following the algorithmic processing, the present invention typically provides for a special hardware design that converts current to voltage, and that subsequently turns relay switches off-and-on so as to set SIN signals in different quadratures. By way of elaboration, following the present invention's Algorithmic Step Seven, signal S1=27 ma and signal S2=14 ma are transmitted to a current-to-voltage conversion circuit 300. Based on the generated currents for S1 and S2, SIN signals are generated at precise angles and amplitudes. Subsequently, these two signals S1 and S2 are added together using two regular transformers 600, thereby obtaining signal S3, which is SIN (Theta+240). Now we have S1, S2, and S3 synchro signals, wherein: S1–S2 (difference) 90 VAC; S2–S3 (difference)=45 VAC; and, S1–S3 (difference)=45 VAC. These three signals with unique voltage values at precise phases represent 270 degrees in this example. When the synchro device 700 (e.g., motor) receives the S1, S2 and S3 signals, the synchro device 700 rotates to 270 degrees.

The functionality of the inventive system is similar to that of current products in the market; however, the internal operations of the commercially available products differ greatly from those of the inventive system. The present invention's unique circuitry makes precise and accurate signals capable of driving higher loads with a faster settling time, and at significantly lower costs.

The present invention's internal operation diagrams shown in FIGS. 4, 7, 8, and 9 illustrate how the inventive "hybrid" DSCU works on a completely different mathematical model to generate synchro signals, as compared to the existing technology such as illustrated in FIGS. 1 and 2. The traditional DSCU design (e.g., FIGS. 1 and 2) has a slow, complex circuitry offering limited features and accuracy. Typical inventive practice can afford greater accuracy as well as comparable attributes such as size and tolerances.

The present invention's 10-16 bits hybrid DSCU is more accurate than current DSCUs. A typical inventive device uses a 16-bits dsPIC30F6014A microcontroller, which constantly executes several interrupts and routines to generate precise digital values. These values are fed to a multiplying DAC via a I2C bus. Thus, external parameters such as heat, radio-frequency exposure, and noise cannot affect the digital data. A later-generated analog signal is processed through OPAMP, high pass filters and encapsulated transformers, which protect the generated analog signals from other distortion. Furthermore, the 16 bits value of typical inventive practice will provide $2^{16}$=65536 data point resolution, as compared to 14 bits $2^{14}$=16384 data point resolution of traditional digital-to-analog synchro conversion practice.

A 10-16 bits hybrid DSCU according to the present invention offers more load capability. For instance, a typical embodiment of an inventive DSCU can supply 14.7 VAC at 400 mA to a single transformer (14.7×0.400=5.88 VA as an input to transformer), with an expected output at 90 VAC @ 64 mA, thus affording 5.88 VA+5.88 VA=11.76 VA total capability. Deducing a 2 VA loss at both transformers, this inventive unit should be able to supply a 10 VA capability, as compared to a typical 4 VA capability of a traditional unit.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A digital-to-synchro converter comprising a computer, at least one digital-to-analog converter, at least one current-to-voltage converter, and at least one transformer, said computer receiving and processing preliminary digital data and transmitting synchro digital data including an S1 signal and an S2 signal, said S1 signal characterized by [V Sin($\omega$t) Sin($\Phi$)], said S2 signal characterized by [V Sin($\omega$t) Sin($\Phi$+120)], said at least one digital-to-analog converter converting said synchro digital data to synchro analog data, said at least one transformer transforming said synchro analog data to modified said synchro analog data including said S1 signal, said S2 signal, and an S3 signal characterized by [V Sin($\omega$t) Sin($\Phi$+240)] and constituting a phase-shift average of said S1 signal and said S2 signal.

2. The digital-to-synchro converter of claim 1, further comprising at least one current-to-voltage converter for converting said synchro digital data from current to voltage, prior to receipt of said synchro digital data by said at least one transformer.

3. The digital-to-synchro converter of claim 1, further comprising at least one amplifier for amplifying said synchro digital data, prior to receipt of said synchro digital data by said at least one transformer.

4. The digital-to-synchro converter of claim 1, further comprising:
at least one current-to-voltage converter for converting said synchro digital data from current to voltage, prior to receipt of said synchro digital data by said at least one transformer;
at least one amplifier for amplifying said synchro digital data, prior to receipt of said synchro digital data by said at least one transformer.

5. A digital-to-synchro conversion device, comprising:
a computer, for processing angularly indicative digital input, the computer having resident in its memory a mathematical algorithm for converting the angularly indicative digital input to angularly radian digital output, the angularly radian digital output including a computer-generated synchro digital signal S1 and a computer-generated synchro digital signal S2, wherein the signal S1 represents [V Sin(ωt) Sin(Φ)], and wherein the signal S2 represents [V Sin(ωt) Sin(Φ+120)];
a digital-to-analog conversion device, for converting the computer-generated synchro digital signal S1 to a synchro analog signal S1 current, and for converting the computer-generated synchro digital signal S2 to a synchro analog signal S2 current;
a current-to-voltage conversion device, for converting the synchro analog signal S1 current to a synchro analog signal S1 voltage, and for converting the synchro analog signal S2 current to a synchro analog signal S2 voltage; and
a transformer device, for transforming the synchro analog signal S1 voltage and the synchro analog signal S2 voltage to a transformed synchro analog signal S1 voltage, a transformed synchro analog signal S2 voltage, and a synchro analog signal S3 voltage, wherein the signal S3 represents [V Sin(ωt) Sin(Φ+240)].

6. The digital-to-synchro conversion device of claim 5, wherein the computer is a microcontroller.

7. The digital-to-synchro conversion device of claim 5, wherein the digital-to-analog conversion device is a multiplying digital-to-analog conversion device.

8. The digital-to-synchro conversion device of claim 5, wherein the signal S3 represents the average of the signal S1 plus the signal S2, with phase shift.

9. The digital-to-synchro conversion device of claim 5, wherein the synchro analog signal S3 voltage represents the average of the transformed synchro analog signal S1 voltage plus the transformed synchro analog signal S2 voltage.

10. The digital-to-synchro conversion device of claim 5, further comprising an amplification device, for amplifying the synchro analog signal S1 voltage and the synchro analog signal S2 voltage, wherein:
the transformer device receives the amplified synchro analog signal S1 voltage and the amplified synchro analog signal;
the transformer device transforms the amplified synchro analog signal S1 voltage and the amplified synchro analog signal S2 voltage to a transformed amplified synchro analog signal S1 voltage, a transformed amplified synchro analog signal S2 voltage, and a synchro analog signal S3 voltage;
the synchro analog signal S3 voltage represents the average of the transformed amplified synchro analog signal S1 voltage plus the transformed amplified synchro analog signal S2 voltage.

11. The digital-to-synchro conversion device of claim 10, wherein the computer is a microcontroller, and wherein the digital-to-analog conversion device is a multiplying digital-to-analog conversion device.

12. A method for converting digital signals to synchro signals, the method comprising:
processing angularly indicative digital input, the processing including using a computer having resident in its memory a mathematical algorithm for converting the angularly indicative digital input to angularly radian digital output, the angularly radian digital output including a computer-generated synchro digital signal S1 and a computer-generated synchro digital signal S2, wherein the signal S1 represents [V Sin(ωt) Sin(Φ)], and wherein the signal S2 represents [V Sin(ωt) Sin(Φ+120)];
converting the computer-generated synchro digital signal S1 to a synchro analog signal S1 current;
converting the computer-generated synchro digital signal S2 to a synchro analog signal S2 current;
converting the synchro analog signal S1 current to a synchro analog signal S1 voltage;
converting the synchro analog signal S2 current to a synchro analog signal S2 voltage; and
transforming the synchro analog signal S1 voltage and the synchro analog signal S2 voltage to a transformed synchro analog signal S1 voltage, a transformed synchro analog signal S2 voltage, and a synchro analog signal S3 voltage, wherein the signal S3 represents [V Sin(ωt) Sin(Φ+240)].

13. The method for converting of claim 12, wherein the computer is a microcontroller.

14. The method for converting of claim 12, wherein the converting of the computer-generated synchro digital signal S1 to a synchro analog signal S1 current, and the converting of the computer-generated synchro digital signal S2 to a synchro analog signal S2 current, include using a multiplying digital-to-analog conversion device.

15. The method for converting of claim 12, wherein the signal S3 represents the average of the signal S1 plus the signal S2, with phase shift.

16. The method for converting of claim 12, wherein the synchro analog signal S3 voltage represents the average of the transformed synchro analog signal S1 voltage plus the transformed synchro analog signal S2 voltage.

17. The method for converting of claim 12, further comprising amplifying the synchro analog signal S1 voltage and the synchro analog signal S2 voltage, wherein:
a transformer device receives the amplified synchro analog signal S1 voltage and the amplified synchro analog signal;
the transforming includes using the transformer device to transform the amplified synchro analog signal S1 voltage and the amplified synchro analog signal S2 voltage to a transformed amplified synchro analog signal S1 voltage, a transformed amplified synchro analog signal S2 voltage, and a synchro analog signal S3 voltage;
the synchro analog signal S3 voltage represents the average of the transformed amplified synchro analog signal S1 voltage plus the transformed amplified synchro analog signal S2 voltage.

18. The method for converting of claim 17, wherein:
the computer is a microcontroller;
the converting of the computer-generated synchro digital signal S1 to a synchro analog signal S1 current, and the converting of the computer-generated synchro digital signal S2 to a synchro analog signal S2 current, include using a multiplying digital-to-analog conversion device.

\* \* \* \* \*